(12) United States Patent
Roy et al.

(10) Patent No.: US 8,803,057 B2
(45) Date of Patent: Aug. 12, 2014

(54) METHOD OF RESETTING A PHOTOSITE, AND CORRESPONDING PHOTOSITE

(75) Inventors: François Roy, Seyssins (FR); Julien Michelot, Grenoble (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 262 days.

(21) Appl. No.: 13/185,301

(22) Filed: Jul. 18, 2011

(65) Prior Publication Data

US 2012/0018619 A1 Jan. 26, 2012

(30) Foreign Application Priority Data

Jul. 21, 2010 (FR) ...................................... 10 55959

(51) Int. Cl.
*H01L 27/146* (2006.01)
*H01L 31/113* (2006.01)

(52) U.S. Cl.
USPC ..................... 250/208.1; 250/214.1; 257/290; 257/773; 257/E27.133

(58) Field of Classification Search
USPC ............ 250/208.1, 214.1; 257/290–292, 432, 257/773, 774, E31.127, E27.133
See application file for complete search history.

(56) References Cited

U.S. PATENT DOCUMENTS

| | | | |
|---|---|---|---|
| 8,390,089 B2 * | 3/2013 | Chen et al. ..................... 257/447 |
| 2007/0052056 A1 | 3/2007 | Doi et al. | |
| 2009/0266973 A1 | 10/2009 | Roy et al. | |
| 2009/0303371 A1 | 12/2009 | Watanabe et al. | |
| 2013/0113061 A1 * | 5/2013 | Lai et al. ....................... 257/432 |

FOREIGN PATENT DOCUMENTS

EP 2 133 918 A2 12/2009

OTHER PUBLICATIONS

République Française Institut National De La Propriété Industrielle, Rapport De Recherche Préliminaire (Preliminary Search Report); issued in French Patent Application No. 1055959 on Mar. 9, 2011 (2 pages).

Matsunaga, Y., et al., "A High-Sensitivity MOS Photo-Transistor for Area Image Sensor," IEEE Transactions on Electron Devices, May 1991, pp. 1044-1047, vol. 38, No. 5, IEEE.

Yamashita, H., et al., "A New High Sensitivity Photo-transistor for Area Image Sensors," IEDM, 1988, pp. 78-81, IEEE.

* cited by examiner

*Primary Examiner* — Kevin Pyo

(74) *Attorney, Agent, or Firm* — Slater & Matsil, L.L.P.

(57) ABSTRACT

A method of resetting a photosite is disclosed. Photogenerated charges accumulated in the photosite are reset by recombining the photogenerated charges with charges of opposite polarity.

26 Claims, 6 Drawing Sheets

METHOD OF RESETTING A PHOTOSITE, AND CORRESPONDING PHOTOSITE

CROSS-REFERENCE TO RELATED APPLICATIONS

This application is a translation of and claims the priority benefit of French patent application number 10-55959, filed on Jul. 21, 2010, which is hereby incorporated by reference to the maximum extent allowable by law.

TECHNICAL FIELD

The invention relates to photosites, especially to back-side illumination photosites and more particularly to the resetting thereof. The invention applies especially to back-side illumination imaging devices.

BACKGROUND

A photosite comprises at least one photodiode and at least one isolation trench zone for isolating the photodiode or photodiodes.

FIG. 1 illustrates a front-side illumination imaging device such as, for example, that described in the article by Matsunaga, et al., Electron Devices, IEEE Transactions, May 1991, 38 (5), pp. 1044-1047 and the article by Yamashita, et al., Electron Devices Meeting, 1988. IEDM '88. Technical Digest, International, 1988, pp. 78-81. This device is a front-side illumination device, which means a device in which the photons pass through the interconnection part (including especially metal tracks or metal levels, separated by dielectric layers and interconnected, in some cases, by vias between the metal levels), which is located above the active components, and especially the read transistor, before arriving on the photodiode.

This interconnection part is commonly denoted by those skilled in the art by the term BEOL (Back End of Line). The device (see FIG. 1) comprises an n-type doped substrate 1 in which a p-doped zone 2 is produced, for example by implantation. Produced above such a structure is an active zone 3, within which the dissociation of the charges takes place by photoelectric effect, and two P+-doped zones 4, 5 located on either side of the active zone, so as to form the source and drain regions of a transistor that has here two superposed gates 6, 7.

In operation, the charges are accumulated in the active zone 3 during a cycle. The charges are accumulated because the p-doped zone 2 forms a potential barrier preventing the charges from rejoining the substrate 1. The accumulated charges are measured by integration by the transistor.

At the start of a new cycle, the accumulated photogenerated charge must be dissipated. To do so, a potential pulse is applied to the gate 6 so as to suppress the potential well in active zone 3. With the potential well suppressed, the photogenerated charges can pass through the zone 2 so as to be discharged into the substrate 1 acting as a draining zone.

The current trend in imaging devices is towards back-side illumination devices because of their high quantum efficiency. The quantum efficiency is the ratio of the number of photogenerated charges to the number of incident photons.

A back-side illumination imaging device is an imaging device in which the photons arrive directly on the photodiode, the interconnection part being produced on that side of the photodiode opposite the side via which the photons arrive, the substrate having been removed during fabrication of the component.

However, the teaching of the prior art is not compatible with such back-side illumination imaging devices. This is because, in the case of a back-side illumination photodiode configuration, the substrate is no longer present and therefore cannot be used as a draining zone.

SUMMARY OF THE INVENTION

According to one embodiment, the invention provides a resetting method for devices benefitting from back-side illumination.

The term "resetting" is understood to mean the dissipation of the photogenerated charge stored in the device.

According to one aspect, the invention defines a method of resetting a photosite, in which the resetting of the photogenerated charges accumulated in the photosite comprises recombination of the photogenerated charges with charges of opposite polarity.

Such a method has the advantage of not requiring a draining layer for resetting the photogenerated charges.

According to one embodiment, the photosite may be bounded laterally by at least two deep isolation trenches produced in a semiconductor region, each trench possessing an electrically conductive internal part. The recombination may comprise creation, in the semiconductor region and in the external vicinity of at least one of the deep isolation trenches, of charges of opposite polarity to that of the photogenerated charges and displacement of the photogenerated charges towards the created charges.

The creation may comprise the application of a potential difference between the semiconductor region and the electrically conductive internal part of the at least one deep isolation trench.

The potential difference may be applied between the drain region of a transistor produced in and on the semiconductor region and the at least one deep isolation trench.

The displacement may comprise application of a potential difference between the electrically conductive internal parts of two deep isolation trenches.

The potential difference applied between at least two deep isolation trenches may periodically change in value.

By applying an alternative potential difference it is possible to regenerate the charges that will be involved in the recombination with the photogenerated charges.

According to another aspect, the invention provides a microelectronic device comprising a photosite for accumulating photogenerated charges and recombination means configured so as to recombine the photogenerated charges with charges of opposite polarity.

The device may comprise at least two deep isolation trenches laterally bounding the photosite. The trenches are produced in a semiconductor region for accumulating the photogenerated charges. Each trench possesses an electrically conductive internal part, and the recombination means comprise first means configured to create, in the external vicinity of at least one of the deep isolation trenches, charges of opposite polarity to that of the photogenerated charges and second means for displacing the photogenerated charges towards the created charges.

The first means may comprise means capable of applying a potential difference between the semiconductor region in the external vicinity of a deep isolation trench and the electrically conductive internal part of the deep isolation trench. The second means may comprise electrical means that are coupled to the deep isolation trenches and capable of applying a potential difference between the internally conductive parts of the deep isolation trenches.

The device may comprise a transistor formed directly on the photosite, in which a doped semiconductor zone connects the drain of the transistor to the interface between the semiconductor region located in the vicinity of a deep isolation trench and the dielectric layer of the deep isolation trench.

The doped semiconductor zone has the advantage of renewing the created charges that are destroyed by recombination with the photogenerated charges.

According to another aspect, the invention provides an imager comprising at least one microelectronic device as defined above.

BRIEF DESCRIPTION OF THE DRAWINGS

Other objectives, features and advantages will become apparent on reading the following description given solely by way of non-limiting example and on referring to the appended drawings in which.

DETAILED DESCRIPTION OF ILLUSTRATIVE EMBODIMENTS

Figure 1:
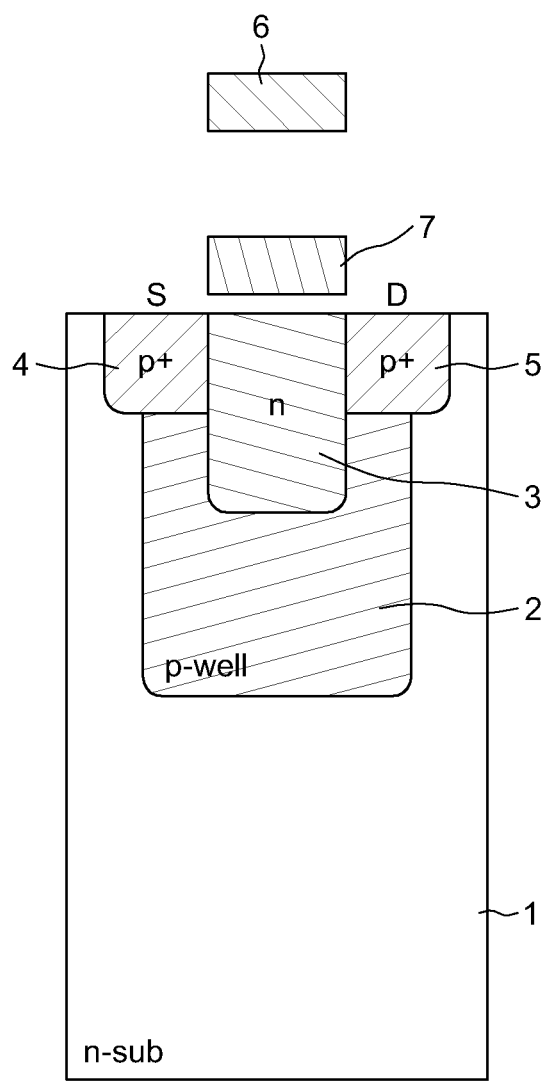
FIG. 1 illustrates an imaging device according to the prior art.
Figure 2:
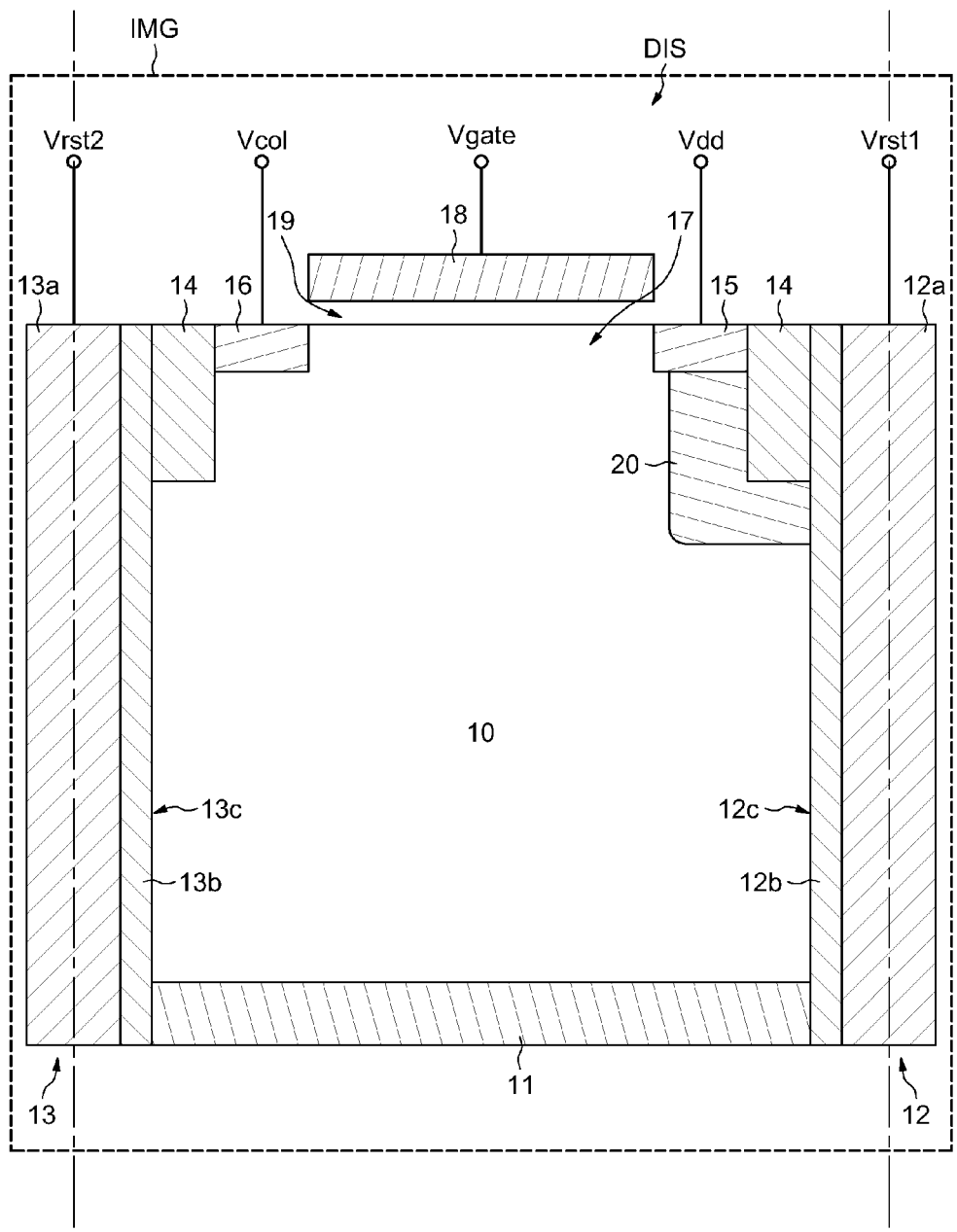
FIG. 2 illustrates one embodiment of an imaging device according to the invention.

In FIG. 2, an imaging device DEV comprises a semiconductor region 10, for example p−−-doped silicon adjacent to an n−−-doped layer 11 forming a pn photodiode intended to be back-side illuminated, i.e., illuminated through the layer 11. The lateral extension of the imaging device is bounded by deep isolation trenches 12, 13 which are themselves surrounded by shallow isolation trenches 14. The deep isolation trenches 12, 13 are trenches comprising external dielectric layers 12b, 13b filled with an electrically conductive material 12a, 13a.

The electrically conductive internal part 12a, the dielectric layer 12b and the semiconductor region 10 located in the vicinity of the dielectric layer 12b form a capacitive structure of the MOS (metal-oxide-semiconductor) type.

The electrically conductive internal part 13a, the dielectric layer 13b and the semiconductor region 10 located in the vicinity of the dielectric layer 13b also form a capacitive structure.

The term "photosite" refers to the structure comprising especially the pn photodiode 10, 11 and the MOS capacitors 12a, 12b, 10 and 13a, 13b, 10.

A transfer transistor is formed in the surface of the semiconductor region 10. Source 16 and drain 15 zones are produced by n+-doping, each zone being directly adjacent to an STI (Shallow Trench Isolation), while still being separated by an active zone 17. The transistor comprises a control gate 18 located above the active zone 17 and isolated from the rest of the device by an insulator layer 19.

An n+-doped semiconductor zone 20 connects the source 15 of the transistor to the interface 12c between the semiconductor region 10 and the dielectric layer 12b. Contacts on the electrically conductive parts of the trenches and on the gate and drain regions enable voltages Vrst2, Vrst1, Vgate and Vdd to be applied to these regions respectively. A contact on the source region enables the voltage Vcol on this source region to be measured.

An imager or image sensor, labeled IMG, comprises at least one device DEV and generally a matrix of photosites. Such a sensor is advantageously a back-side illumination sensor.

Figure 3:
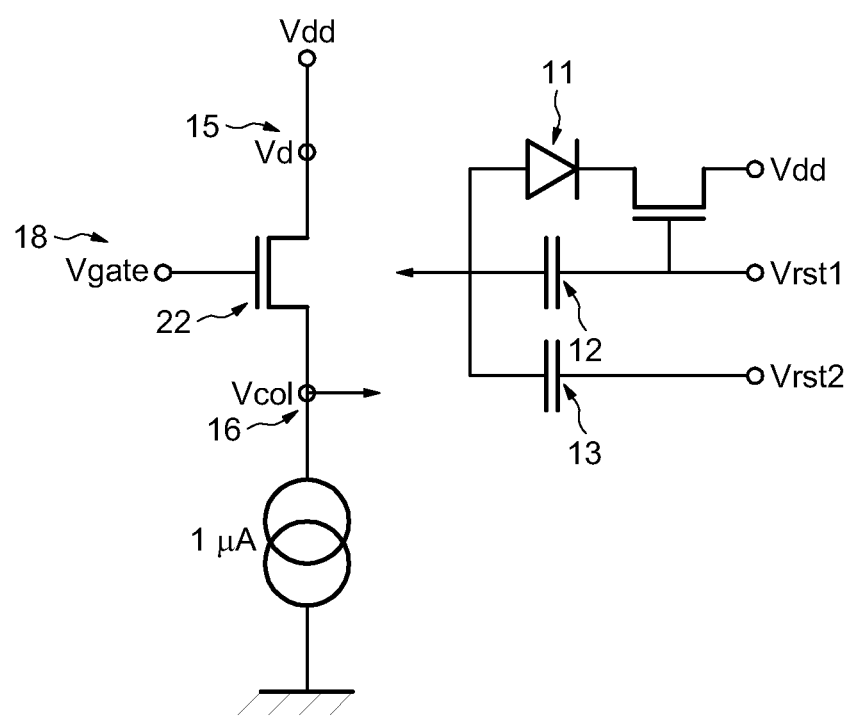
FIG. 3 illustrates the equivalent circuit diagram of the imaging device of FIG. 2.

The equivalent circuit components of the imaging device described in FIG. 2 may be seen in FIG. 3. This figure shows, on the one hand, the read transistor 22 and, on the other hand, the aforementioned capacitive structures. The substrate 10 is not connected to ground, but is subjected to a floating potential via the capacitive structures.

Figure 4:
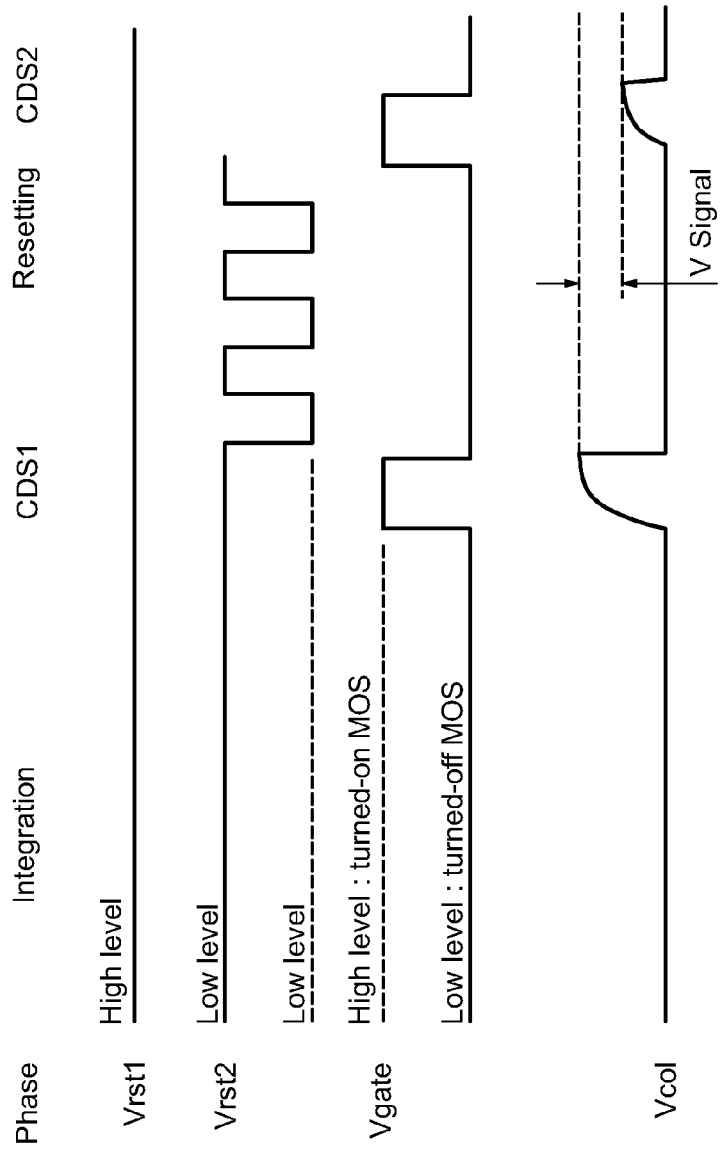
FIG. 4 illustrates an example of a timing diagram for the signals applied to the various control terminals of an imaging device according to the invention.

FIG. 4 illustrates the operating phases of the photosite.

The first phase is the integration phase. During the integration phase, the read transistor is in the off-state and charges are photogenerated and accumulated in the photosite.

The next phase is a first read phase, denoted by CDS1, during which a first collector voltage Vcol is measured. To do this, the gate voltage Vgate is modified so as to turn on the transistor. After this measurement, the gate voltage Vgate is again modified, so as to turn off the transistor.

There follows a phase of resetting the photogenerated charges, during which, for example, the potential Vrst1 applied to the first deep isolation trench 12 varies alternately between a high level and a low level. Simultaneously, the potential Vrst2 applied to the second deep isolation trench 13 is kept constant at a high level.

By applying these potentials it is possible, when they are equal, to create charges of opposite polarity to that of the photogenerated charges and, when they are different, to displace the photogenerated charges and stimulate their recombination with the charges of opposite polarity retained in this zone on charge-trapping sites. The charge-trapping sites comprise structural defects present at the interface between the dielectric layer 12b, 13b and the semiconductor region 10. These structural defects appear spontaneously and may be created by various methods to those skilled in the art, such as, for example, localized bombardment by a beam of particles.

Applying different potentials also makes it possible to repel, by electrostatic effect, the electrons that have accumulated at the interface and to attract the holes towards this interface, promoting recombination of the electron-hole pairs during this transient period.

The last phase is a second read phase, denoted by CDS2, during which a second voltage Vcol is measured. To do this, the gate voltage Vgate is modified in order to turn on the transistor. After this measurement, the gate voltage Vgate is again modified in order to turn off the transistor. The second voltage Vcol characterizes the full depletion of the region 10. Since the region 10 is n-doped, the majority carriers that it contains are electrons. Within these majority carriers, some are "free", or free charges, because of their ability to move in the crystal lattice of the region 10. When the region 10 is fully depleted, the majority carriers contain no free charges. Only the charge corresponding to the dopants which will have lost their free charge remains. The useful signal corresponds to the difference between the two voltages Vcol.

At the end of this last phase, the photosite is available for a new integration phase.

Figure 5:
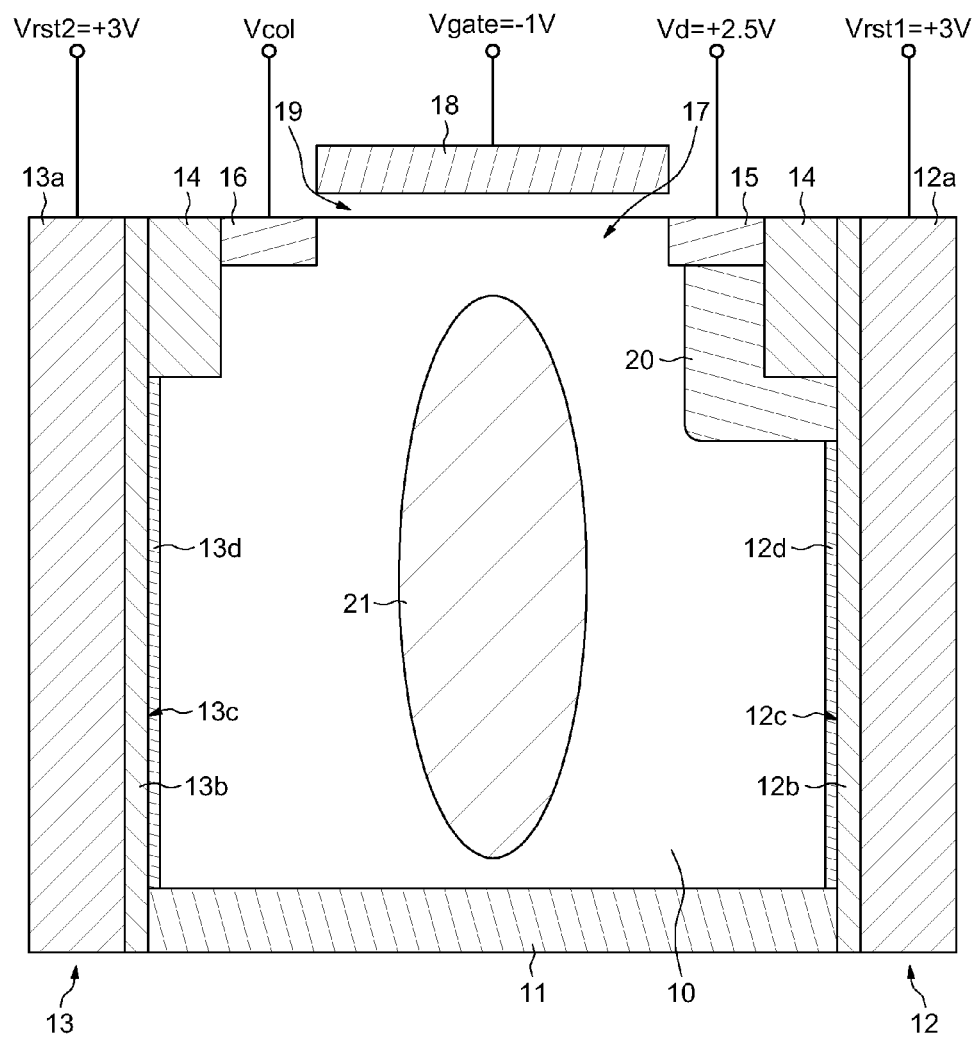
FIG. 5 illustrates examples of various potentials within an imaging device according to the invention during creation of the charges.

FIG. 5 illustrates the creation of charges of opposite polarity to that of the photogenerated charges and first charge creation means. Photogenerated charges are created by the photoelectric effect when the device is exposed to electromagnetic radiation, for example, light. Here, the photogenerated charges are holes.

To create a layer of electrons with which the photogenerated holes can recombine, a potential above the potential applied to the drain 15 is applied to the deep isolation trenches 12, 13. The MOS (metal-oxide-semiconductor) structure defined by an electrically conductive internal part 12a, a dielectric layer 12b and a semiconductor region 10 is then considered to be a reverse-biased capacitor. The electrons of the semiconductor region 10 are attracted towards the interface 12c with the dielectric layer 12b. Moreover, the interface 12c is connected to the interface 13c. The interface 12c and the interface 13c are therefore at the same potential. The reverse-biased capacitor effect is therefore also manifested in the MOS structure comprising the electrically conductive internal part 12a, the dielectric layer 12b and the semiconductor region 10.

By applying the potentials described above, layers 12d, 13d of charges (here electrons) of opposite polarity to the polarity of the photogenerated charges are therefore obtained in the vicinity of the external surface of the deep isolation trenches. These charges are also and principally supplied by the drain of the surface transistor, this drain behaving as the source of inversion charges of a MOS capacitor produced with the deep trenches.

Possible potentials are +3 V on the deep isolation trenches 12, 13 and Vd=+2.5 V on the drain 15.

When the potentials applied to the deep isolation trenches 12, 13 become different, the effect, whereby charges of opposite polarity to that of the photogenerated charges are created, is broken. The created charges of opposite polarity disappear, with the exception of some of them that remain trapped in charge-trapping sites.

Figure 6:
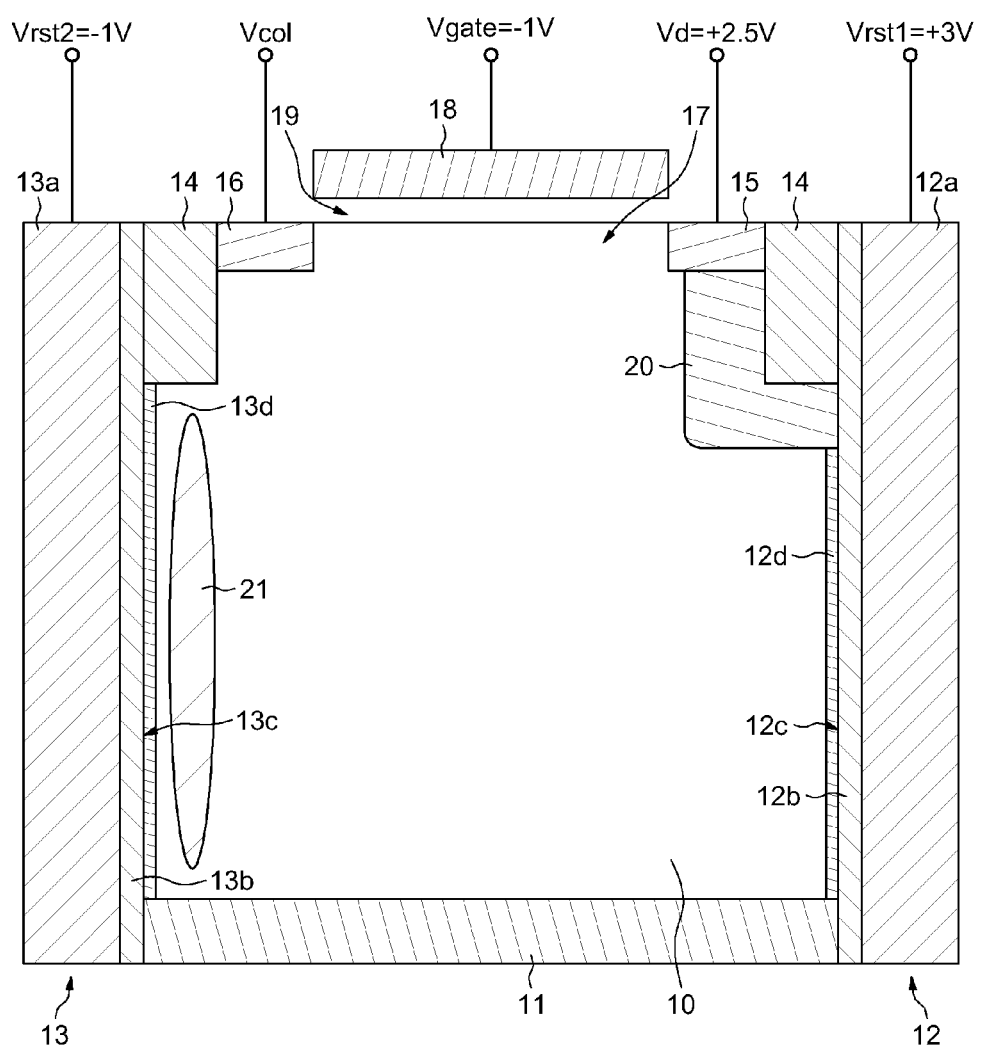
FIG. 6 illustrates examples of various potentials within an imaging device according to the invention during displacement of the photogenerated charges.

FIG. 6 illustrates the displacement of the photogenerated charges and the second photogenerated-charge displacement means. At this stage of the resetting, the imaging device comprises photogenerated charges 21 present in the semiconductor region 10 and created charges 12d, 13d present at the interfaces 12c, 13c. The resetting method continues with the displacement of the photogenerated charges towards the interfaces 12c, 13c, generating an electric field. The photogenerated charges, one of the characteristics of which is the ability to move freely, are subjected to a Coulomb force. The photogenerated charges therefore move collinearly with the electric field generated.

To generate an electric field, the potential of at least one of the deep isolation trenches 12, 13 is modified so as to create a spatial potential gradient between at least two deep isolation trenches 12, 13. For example, a potential Vrst1=+3 V may be applied to a first deep isolation trench 12 and a potential Vrst2=−1 V to a second deep isolation trench 13. A potential gradient then appears that enables the photogenerated charges to be attracted towards the capacitive second deep isolation electrode 13, the photogenerated charges here being holes.

When the photogenerated charges arrive in the vicinity of the interface 13c, electron-hole recombination takes place with the electrons 13d that have been created and have remained localized in the charge traps present in this zone. However, the number of electrons 13d available may be insufficient to allow recombination with all the photogenerated charges. It is then useful to attract the photogenerated charges towards the first deep isolation trench 12. To do this, the direction of the potential gradient is changed, for example, by applying a potential Vrst1=−1 V to the first deep isolation trench 12, and a potential Vrst2=+3 V to the second deep isolation trench 13, while still maintaining a potential Vd=+2.5 V on the drain 15.

During the period when the photogenerated charges move from the interface 13c towards the interface 12c, the electrons present at the interface may be renewed from the drain 15 of the transistor via the n−-doped semiconductor zone 20, from the first interface 12c and from the n−-doped layer 11.

When the photogenerated charges arrive in the vicinity of the interface 12c, electron-hole recombination takes place. It is thus possible to alternate the recombinations on the interfaces 12c, 13c until complete resetting of the photogenerated charges. Throughout the resetting phase, the transistor is in the off-state, by a potential Vgate=−1 V having been applied to the control gate.

Moreover, those photogenerated charges moved to the vicinity of the interfaces 12c, 13c, which had not undergone recombination may be trapped by the charge-trapping sites present in this zone in the same way as the created charges of opposite polarity may be trapped. During creation of new charges intended for recombination, the photogenerated charges trapped on the defects are then recombined. It will be noted that certain charge-trapping sites, called amphoteric sites, may trap positive and negatives charges simultaneously. These sites have the advantage of being able to attract the photogenerated charges and the charges of opposite polarity simultaneously. When the two types of charge are attracted, recombination takes place on the trapping site. The sites enable the probability of recombination to be increased.

As may be seen, the present imaging device allows the accumulated charge to be reset by recombination of the charges and not by elimination via a draining layer, as in the prior art.

Moreover, by using deep isolation trenches 12, 13 it is possible to combine mutual isolation of the photosites with resetting of the photogenerated charges.

What is claimed is:

1. A method of resetting a photosite that is bounded laterally by at least two deep isolation trenches disposed in a semiconductor region, each trench possessing an electrically conductive internal part, the method comprising:
    resetting photogenerated charges accumulated in the photosite by recombining the photogenerated charges with charges of opposite polarity;
    wherein recombining comprises:
        creating, in the semiconductor region and in an external vicinity of at least one of the deep isolation trenches, charges of opposite polarity to that of the photogenerated charges; and
        displacing the photogenerated charges towards the created charges, wherein the displacing comprises applying a potential difference between the electrically conductive internal parts of the at least two deep isolation trenches.

2. The method according to claim 1, wherein the creating comprises applying a potential difference between the semiconductor region and the electrically conductive internal part of at least one deep isolation trench.

3. The method according to claim 2, wherein the potential difference is applied between a drain region of a transistor produced in and on the semiconductor region and the at least one deep isolation trench.

4. The method according to claim 1, wherein the potential difference applied between the electrically conductive internal parts of the at least two deep isolation trenches periodically changes in value.

5. The method of claim 1, wherein the method further comprises:
photogenerating a plurality of charges in the semiconductor region; and
wherein recombining the photogenerated charges comprises pulsing a capacitor in a vicinity of the semiconductor region to cause the photogenerated charges to recombine with the charges of opposite polarity.

6. The method according to claim 5, wherein pulsing the capacitor comprises applying a signal to an electrically conductive internal portion of a first one of the deep isolation trenches.

7. The method according to claim 6, wherein the signal comprises a signal that goes from a low voltage level to a high voltage level and back to the low voltage level.

8. The method according to claim 6, wherein the signal comprises a signal that goes from a low voltage level to a high voltage level, back to the low voltage level and back to the high voltage level.

9. The method according to claim 6, further comprising applying a high voltage level to the electrically conductive internal part of a second one of the deep isolation trenches, the high voltage level being applied at least during the pulsing of the capacitor, the second deep isolation trench being spaced from the first deep isolation trench by the semiconductor region.

10. A microelectronic device comprising:
a photosite for accumulating photogenerated charges;
first and second deep isolation trenches laterally bounding the photosite, the trenches being disposed in a semiconductor body, each trench comprising an electrically conductive internal part; and
recombination means for recombining the photogenerated charges with charges of opposite polarity;
wherein the recombination means comprise first means configured to create, in an external vicinity of at least one of the deep isolation trenches, charges of opposite polarity to that of the photogenerated charges and second means for displacing the photogenerated charges towards the created charges;
wherein the first means comprises means for applying a potential difference between the semiconductor region in the external vicinity of the first deep isolation trench and the electrically conductive internal part of the first deep isolation trench; and
wherein the second means comprises electrical means coupled to the first and second deep isolation trenches for applying a potential difference between the internally conductive parts of the first and second deep isolation trenches.

11. The device according to claim 10, further comprising a transistor formed directly on the photosite, wherein a doped semiconductor zone connects a drain of a transistor to an interface between a semiconductor region located in a vicinity of the first deep isolation trench and a dielectric layer of the first deep isolation trench.

12. The microelectronic device of claim 10, wherein the photosite comprises:
a semiconductor body of a first conductivity type;
a transistor disposed at an upper portion of the semiconductor body; and
the semiconductor region which is of a second conductivity type and is disposed at a lower portion of the semiconductor body and vertically spaced from the transistor by the semiconductor body, the second conductivity type opposite the first conductivity type.

13. The microelectronic device according to claim 12, wherein the transistor comprises a source region of the second conductivity type and a drain region of the second conductivity type, the source and drain regions separated by a channel region of the first conductivity type, the transistor further comprising a gate overlying the channel region and electrically insulated therefrom by a gate dielectric.

14. The microelectronic device according to claim 13, further comprising a doped semiconductor zone that electrically connects the drain region to an interface between the semiconductor body and the first deep isolation trench.

15. The microelectronic device according to claim 14, further comprising a first shallow trench isolation region between the drain region and the first deep isolation trench and a second shallow trench isolation between the source region and the second deep isolation trench.

16. The microelectronic device according to claim 13, wherein the channel region is disposed in the upper portion of the semiconductor body.

17. The microelectronic device according to claim 13, further comprising:
a first reset voltage node coupled to the electrically conductive internal part of the first deep isolation trench;
a second reset voltage node coupled to the electrically conductive internal part of the second deep isolation trench;
a collector voltage node coupled to the source region; and
a reference voltage node coupled to the drain region.

18. The microelectronic device according to claim 12, wherein the first conductivity type is p-type and the second conductivity type is n-type.

19. The method of claim 1, wherein the photosite comprises a semiconductor body, and a transistor adjacent the semiconductor body, the at least two deep isolation trenches including first and second deep isolation trenches that vertically extend from an upper portion of the semiconductor body to a lower portion of the semiconductor body, each deep isolation trench further comprising a dielectric layer, the electrically conductive internal part being separated from the semiconductor body by the dielectric layer, the semiconductor region being part of the semiconductor body, the method further comprising:
during an integration phase, accumulating photogenerated charges in the semiconductor body;
during a first read phase after the integration phase, turning on the transistor; and
during a resetting phase after the first read phase, applying a reset voltage to an internal portion of the first deep isolation trench.

20. The method according to claim 19, further comprising, during a second read phase after the resetting phase, turning on the transistor.

21. The method according to claim 20, wherein an amount of accumulated photogenerated charges is determined by comparing a voltage at the transistor after the first read phase with a voltage at the transistor after the second read phase.

22. The method according to claim 21, wherein an amount of accumulated photogenerated charges is determined by comparing a voltage at a source of the transistor after the first read phase with a voltage at the source of the transistor after the second read phase.

23. The method according to claim 19, wherein applying the reset voltage comprises applying a reset signal that varies alternately between a high level and a low level while simultaneously applying a constant voltage to an internal portion of the second deep isolation trench.

24. The microelectronic device of claim 10, wherein the microelectronic device further comprises:
- a plurality of additional photosites, each additional photosite comprising:
  - a semiconductor body of a first conductivity type;
  - a semiconductor region of a second conductivity type adjacent the semiconductor body so that the semiconductor body and the semiconductor region form a pn junction; and
  - first and second deep isolation trenches laterally bounding the semiconductor body, each deep isolation trench comprising an electrically conductive internal portion and a dielectric layer, the electrically conductive internal portion being separated from the semiconductor body by the dielectric layer; and
- at least one transistor disposed such that each of the photosites is electrically coupled to the at least one transistor.

25. The microelectronic device according to claim 24, wherein the photosites are arranged in a matrix.

26. The microelectronic device according to claim 24, wherein the microelectronic device comprises a back-side illumination sensor.

* * * * *